US009117911B2

(12) United States Patent
Antonenkov

(10) Patent No.: US 9,117,911 B2
(45) Date of Patent: Aug. 25, 2015

(54) DISPLAY SUBSTRATE AND METHOD OF MANUFACTURING THE SAME

(71) Applicant: Samsung Display Co., Ltd., Yongin, Gyeonggi-Do (KR)

(72) Inventor: Dmitry Antonenkov, Cheonan-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/321,979

(22) Filed: Jul. 2, 2014

(65) Prior Publication Data

US 2015/0008436 A1    Jan. 8, 2015

(30) Foreign Application Priority Data

Jul. 5, 2013 (KR) .................. 10-2013-0079141

(51) Int. Cl.
*H01L 29/786* (2006.01)
*H01L 33/08* (2010.01)
*H01L 21/84* (2006.01)
*H01L 29/66* (2006.01)

(52) U.S. Cl.
CPC ........ *H01L 29/786* (2013.01); *H01L 29/66477* (2013.01)

(58) Field of Classification Search
CPC ................... H01L 29/789; H01L 29/66477
USPC .......... 257/43, 59, 66, 72, 347, E27.111, 257/E29.147, E29.151, E33.053; 438/22, 438/30, 34, 82
See application file for complete search history.

(56) References Cited

U.S. PATENT DOCUMENTS

| | | | | |
|---|---|---|---|---|
| 5,847,781 | A * | 12/1998 | Ono et al. | 349/44 |
| 7,439,593 | B2 | 10/2008 | Choi et al. | |
| 2007/0218601 | A1* | 9/2007 | Seo et al. | 438/151 |
| 2014/0021475 | A1* | 1/2014 | Moon et al. | 257/59 |

FOREIGN PATENT DOCUMENTS

| | | |
|---|---|---|
| KR | 1020050101637 A | 10/2005 |
| KR | 1020070062647 A | 6/2007 |
| KR | 1020090097003 A | 9/2009 |

* cited by examiner

*Primary Examiner* — Dao H Nguyen
(74) *Attorney, Agent, or Firm* — Cantor Colburn LLP

(57) ABSTRACT

A display substrate includes a base substrate, a gate-line on the base substrate, a data-line crossing the gate-line, a pixel area defined on the base substrate, a gate-pad part connected to an end portion of the gate-line and including a gate corrosion member, and a data-pad part connected to an end portion of the data-line and including a data corrosion member.

18 Claims, 6 Drawing Sheets

DISPLAY SUBSTRATE AND METHOD OF MANUFACTURING THE SAME

This application claims priority to Korean patent Application No. 10-2013-0079141, filed on Jul. 5, 2013, and all the benefits accruing therefrom under 35 U.S.C. §119, the disclosure of which is hereby incorporated by reference herein in its entirety.

BACKGROUND

1. Field

Exemplary embodiments relate generally to a display device. More particularly, exemplary embodiments of the invention relate to a display substrate, and a method of manufacturing the display substrate.

2. Description of the Related Art

Generally, a display substrate includes at least one gate line, at least one data line, at least one switching element, at least one pad part, etc.

A conventional pad part is on an external portion of the display substrate to receive a signal from outside thereof. That is, since the pad part is exposed to outside, the pad part may be easily corroded by oxygen and moisture if the pad part includes a metal.

A contact resistance between a metal contact of the pad part and a metal contact of an external circuit part may be increased due to a corrosion of the pad part. Hence, the corrosion of the pad part may cause a dark pixel in the display substrate. As a result, reliability of the display substrate may be degraded.

SUMMARY

One or more exemplary embodiment provides a display substrate having improved reliability.

One or more exemplary embodiment provides a method of manufacturing a display substrate having improved reliability.

According to an exemplary embodiments, a display substrate includes a base substrate, a gate-line on the base substrate; a data-line intersecting the gate-line; a pixel area defined on the base substrate; a gate-pad part connected to an end portion of the gate-line and including a gate corrosion member; and a data-pad part connected to an end portion of the data-line and including a data corrosion member.

In exemplary embodiments, the gate-pad part may include a first gate-pad connected to the end portion of the gate-line, a second gate-pad on the first gate-pad and including the gate corrosion member, and a gate-pad electrode connected to the second gate-pad.

In exemplary embodiments, the gate-pad part may further include a passivation layer on the gate-line, and a contact hole defined in the passivation layer and exposing the second gate-pad.

In exemplary embodiments, the data-pad part may include a first data-pad connected to the end portion of the data-line, a second data-pad don the first data-pad and including the data corrosion member, and a data-pad electrode connected to the second data-pad.

In exemplary embodiments, the data-pad part may further include a passivation layer on the data-line, and a contact hole defined in the passivation layer and exposing the second data-pad.

In exemplary embodiments, the gate and data corrosion member may include at least one of a noble metal, and a conductive material having corrosion resistance.

In exemplary embodiments, the noble metal may include at least one of gold (Au), nickel (Ni), platinum (Pt), palladium (Pd), rubidium (Ru), iridium (Ir), and alloys thereof.

In exemplary embodiments, the display substrate may further include a switching element including a gate electrode extended from the gate-line, a source electrode extended from the data-line, and a drain electrode spaced apart from the source electrode, and a pixel electrode connected to the switching element.

According to another exemplary embodiment, a method of manufacturing the display substrate includes forming a gate-line on a base substrate; forming a data-line intersecting the gate-line; defining a pixel area on the base substrate; forming a gate-pad part including a gate corrosion member, connected to an end portion of the gate-line; and forming a data-pad part including a data corrosion member, connected to an end portion of the data-line.

In exemplary embodiments, the forming the gate-pad part may include forming a gate metal layer on the base substrate, forming a first gate-pad by patterning the gate metal layer; forming a second gate-pad including the gate corrosion member, on the first gate-pad, and forming a gate-pad electrode connected to the second gate-pad.

In exemplary embodiments, the forming the gate-pad part may further include forming a gate insulating layer on the second gate-pad, forming a passivation layer on the gate insulating layer, and forming a first contact hole in the passivation layer and exposing the second gate-pad.

In exemplary embodiments, the forming the second gate-pad may include a sputtering process, an evaporation process, a chemical vapor deposition process, an atomic layer deposition process, or a vacuum deposition process.

In exemplary embodiments, the forming the data-pad part may include forming a data metal layer on the gate insulating layer, forming a first data-pad by patterning the data metal layer, forming a second data-pad including the data corrosion member, on the first data-pad, and forming a data-pad electrode connected to the second data-pad.

In exemplary embodiments, the forming the data-pad part may further include forming the passivation layer on the second data-pad, and forming a second contact hole in the passivation layer and exposing the second data-pad.

In exemplary embodiments, the forming second data-pad may include a sputtering process, an evaporation process, a chemical vapor deposition process, an atomic layer deposition process, or a vacuum deposition process.

In exemplary embodiments, the gate and data corrosion member may include at least one of a noble metal, and a conductive material having corrosion resistance.

In exemplary embodiments, the noble metal may include at least one of gold, nickel, platinum, palladium, rubidium, iridium, and alloys thereof.

In exemplary embodiments, the conductive material having the corrosion resistance may include at least one of indium tin oxide and indium zinc oxide.

In exemplary embodiments, the method may further include forming a switching element including a gate electrode extended from the gate-line, a source electrode extended from the data-line, and a drain electrode spaced apart from the source electrode, and forming a pixel electrode connected to the switching element.

Therefore, one or more exemplary embodiment of a display substrate according to the invention may have improved reliability by reducing or effectively preventing a corrosion of at least one pad part (e.g., at least one gate-pad part and/or at least one data-pad part) because the pad part includes a corrosion member to reduce or effectively prevent damage to the pad part by water or gas which permeates into the pad part, and processes during manufacturing of the display substrate.

In addition, one or more exemplary embodiment of a method of manufacturing a display substrate according to the invention may reduce manufacturing-costs of the display substrate by forming a corrosion member only on a pad part of the display substrate (e.g., at least one gate-pad part and/or at least one data-pad part) such as by using a thin film deposition process.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

Figure 1:
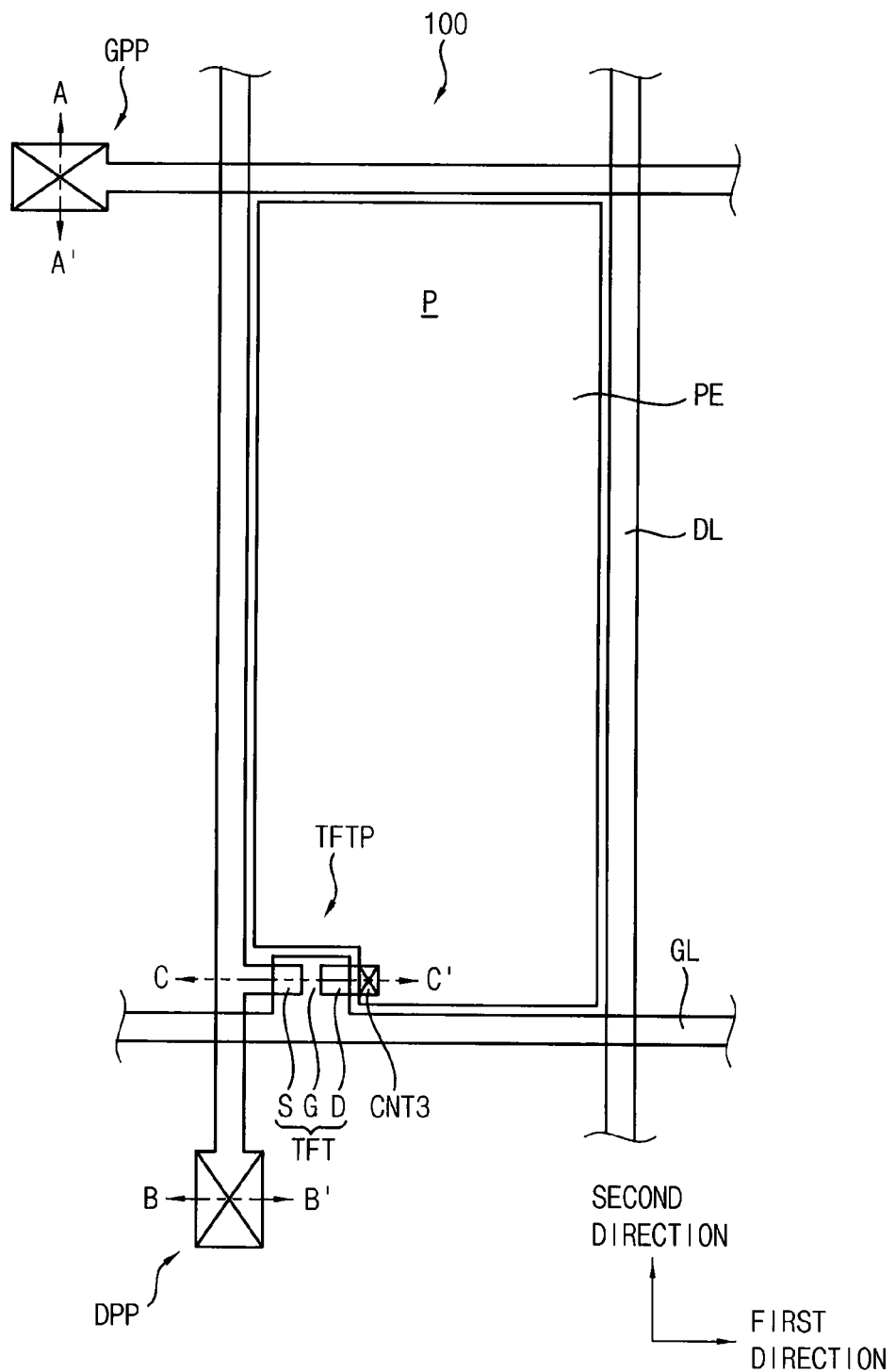
FIG. 1 is a plan view illustrating an exemplary embodiment of a display substrate in accordance with the invention.

Various exemplary embodiments will be described more fully hereinafter with reference to the accompanying drawings, in which some exemplary embodiments are shown. The invention may, however, be embodied in many different forms and should not be construed as limited to the exemplary embodiments set forth herein. Rather, these exemplar embodiments are provided so that this disclosure will be thorough and complete, and will fully convey the scope of the invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2:
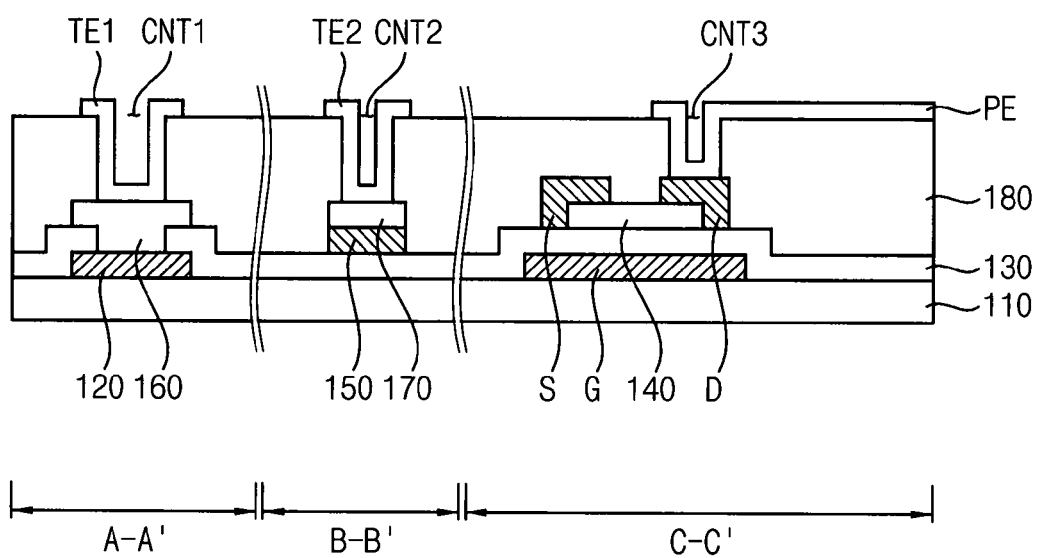
FIG. 2 is a cross-sectional view illustrating the display substrate of FIG. 1.

FIG. 1 is a plan view illustrating an exemplary embodiment of a display substrate in accordance with the invention. FIG. 2 is a cross-sectional view illustrating the display substrate of FIG. 1. Here, an A-A' region illustrated in FIG. 2 may correspond to a gate-pad part GPP illustrated in FIG. 1, a B-B' region illustrated in FIG. 2 may correspond to a data-pad part DPP illustrated in FIG. 2, and a C-C' region illustrated in FIG. 2 may correspond to a switching element part TFTP illustrated in FIG. 2.

Referring to FIGS. 1 and 2, a display substrate 100 may include at least one pixel region P defined therein, at least one gate-line GL disposed on a base substrate 110 and extended along a first direction, at least one data-line DL disposed on the base substrate 110, where the data-line DL is extended in a second direction different than the first direction and intersects with the gate-line GL, at least one gate-pad part GPP connected to a terminal end portion of the gate-line GL, at least one data-pad part DPP connected to a terminal end portion of the data-line DL, etc. In one exemplary embodiment, the pixel region P may be defined by the gate-line GL and the data-line DL, but the invention is not limited thereto or thereby. The display substrate 100 may further include at least one switching element part TFTP and at least one pixel electrode PE in the pixel region P.

The base substrate 110 may include a transparent insulating substrate. In one exemplary embodiment, for example, the base substrate 110 may include a glass substrate, a quartz substrate, a transparent resin substrate, etc. Examples of the transparent resin substrate for the base substrate 110 may include polyimide-based resin, acryl-based resin, polyacrylate-based resin, polycarbonate-based resin, polyether-based resin, sulfonic acid-containing resin, polyethyleneterephthalate-based resin, etc.

In exemplary embodiments, a buffer layer (not shown) may be disposed on the base substrate 110. The buffer layer may prevent diffusion of metal atoms and/or impurities from the base substrate 110 to other elements of the display substrate 100. The base substrate 110 may have a relatively irregular surface. Where the base substrate 110 has the relatively irregular surface, the buffer layer may improve flatness of the surface of the base substrate 110. The buffer layer may include a silicon compound. In one exemplary embodiment, for example, the buffer layer may include silicon oxide (SiOx), silicon nitride (SiNx), silicon oxynitride (SiOxNy), silicon oxycarbide (SiOxCy), silicon carbon nitride (SiCxNy), etc. (x, y: natural number). These aforementioned materials may be used alone or in a combination thereof. The buffer layer may have a single-layer structure or a multi-layer structure. In one exemplary embodiment, for example, the buffer layer may have a single-layer structure including a silicon oxide film, a silicon nitride film, a silicon oxynitride film, a silicon oxycarbide film, or a silicon carbon nitride film. Alternatively, the buffer layer may have a multi-layer structure including at least two of a silicon oxide film, a silicon nitride film, a silicon oxynitride film, a silicon oxycarbide film, a silicon carbon nitride film, etc.

The gate-line GL may be disposed on the base substrate 110 and extended along the first direction. In exemplary embodiments, the gate-line GL may have a single-layer structure including a metal layer having a relatively low electrical resistance. Alternatively, the gate-line GL may have a multi-layer structure including at least two metal layers different from each other. The gate-pad part GPP may be physically and/or electrically connected to the terminal end portion of the gate-line GL.

A length of the gate-line GL is taken in the first direction and a width thereof is taken in a direction perpendicular to the first direction. A width of the gate-pad part GPP may be taken in the same direction perpendicular to the first direction. In exemplary embodiments, a width of the gate-pad part GPP may be greater than a width of the gate-line GL.

The gate-pad part GPP may include a first gate-pad 120, a second gate-pad 160 and a gate-pad electrode TE1.

The data-line DL may be disposed on the base substrate 110 and extended along a second direction, where the second direction intersects with the first direction. In exemplary embodiments, the data-line DL may include a metal layer having relatively low electrical resistance. Alternatively, the data-line DL may have a multi-layer structure including at least two metal layers different from each other. The data-pad part DPP may be connected to the terminal end portion of the data-line DL.

A length of the data-line DL is taken in the second direction and a width thereof is taken in a direction perpendicular to the second direction. A width of the data-pad part DPP may be taken in the same direction perpendicular to the second direction. In exemplary embodiments, a width of the data-pad part DPP may be greater than a width of the data-line DL.

The data-pad part DPP may include a first data-pad 150, a second data-pad 170, and a data-pad electrode TE2.

The gate-pad part GPP may include the first gate-pad 120, a gate insulating layer 130, the second gate-pad 160, a passivation layer 180 and the gate-pad electrode TE1. A first contact hole CNT1 that exposes the second gate electrode 160, is defined in the passivation layer 180.

The first gate-pad 120 may be physically and/or electrically connected to the terminal end portion of the gate-line GL. In exemplary embodiments, the first gate-pad 120 and the gate-line GL may include a same gate metal layer and be in and/or on a same layer of the display substrate 100.

The second gate-pad 160 may be on the first gate-pad 120 and may include a corrosion member. In exemplary embodiments, the corrosion member may include at least one of a noble metal, and a conductive material having corrosion resistance. In one exemplary embodiment, for example, the noble metal may include at least one of gold (Au), nickel (Ni), platinum (Pt), palladium (Pd), rubidium (Ru), iridium (Ir), and alloys thereof. The conductive material having the corrosion resistance may include at least one of indium tin oxide ("ITO") and indium zinc oxide ("IZO"). However, the corrosion member is not limited thereto.

Therefore, one or more exemplary embodiment of the display substrate 100 according to the invention may have improved reliability by reducing or effectively preventing corrosion of at least one gate-pad part GPP because the second gate-pad 160 thereof includes a corrosion member to reduce or effectively prevent damage to the gate-pad part GPP by water or gas which permeates into the pad part, and other conditions applied thereto during a process of manufacturing the display substrate 100. In addition, an exemplary embodiment of a method of manufacturing the display substrate 100 according to the invention may reduce manufacturing-costs of the display substrate 100 by forming a corrosion member on only a gate-pad part (e.g., the second gate-pad 160) such as by using a thin film deposition process.

The passivation layer 180 may be on the base substrate 110 including the gate-line GL, the switching element part TFTP and the data-line DL thereon, so that damage to the gate-line GL, the switching element part TFTP and the data-line DL may be reduced or effectively prevented by processes during manufacturing of the display substrate 100. In exemplary embodiments, the passivation layer 180 may include silicon nitride.

The first contact hole CNT1 may be defined in the passivation layer 180 and expose the second gate-pad 160. Accordingly, the second gate-pad 160 may be connected to the gate-pad electrode TE1 via the first contact hole CNT1.

The data-pad part DPP may include the first data-pad 150, the second data-pad 170, the passivation layer 180 and the data-pad electrode TE2. A second contact hole CNT2 that exposes the second data-pad 170, is defined in the passivation layer 180.

The first data-pad 150 may be physically and/or electrically connected to the terminal end portion of the data-line DL. In exemplary embodiments, the first data-pad 150 and the data-line DL may include a same data metal layer and be in and/or on a same layer of the display substrate 100.

The second data-pad 170 may be on the first data-pad 150 and may include a corrosion member. In exemplary embodiments, the corrosion member may include at least one of a noble metal, and a conductive material having corrosion resistance. In one exemplary embodiment, for example, the noble metal may include at least one of gold, nickel, platinum, palladium, iridium, and alloys thereof. The conductive material having the corrosion resistance may include at least one of ITO and IZO. However, the corrosion member of the invention is not limited thereto.

Therefore, one or more exemplary embodiment of the display substrate 100 according to the invention may have improved reliability by reducing or effectively preventing corrosion of at least one data-pad part DPP because the second data-pad 170 includes a corrosion member to reduce or effectively prevent damage to the data-pad part DPP by water or gas which permeates into the pad part, and processes during manufacturing of the display substrate 100. In addition, an exemplary embodiment of a method of manufacturing the display substrate 100 according to the invention may reduce manufacturing-costs of the display substrate 100 by forming a corrosion member only on a data-pad part (e.g., the second data-pad 170) such as by using a thin film deposition process.

The switching element part TFTP may include at least one switching element TFT. (e.g., a thin film transistor). In exemplary embodiments, the switching element may include a gate electrode G extended from the gate-line GL, the gate insulating layer 130, a semiconductor layer 140, a source electrode S extended from the data-line DL, a drain electrode D spaced apart from the source electrode S, and the passivation layer 180. A third contact hole CNT3 is defined in the passivation layer 180 and exposes one of the source and drain electrodes S and D.

The gate electrode G may be physically and/or electrically connected to the gate-line GL. In exemplary embodiments, the gate electrode G may include metal, alloy, conductive metal oxide, a transparent conductive material, etc. In one exemplary embodiment, for example, the gate electrode 127 may include aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), zinc oxide (ZnOx), ITO, tin oxide (SnOx), indium oxide (InOx), gallium oxide (GaOx), IZO, etc. (x: natural number)

The gate insulating layer 130 may include silicon oxide, metal oxide, etc. Examples of the metal oxide in the gate insulating layer 130 may include silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in a combination thereof. (x: natural number)

The semiconductor layer 140 may include silicon, semiconductor oxide, etc.

The source electrode S may be physically and/or electrically connected to the data-line DL. The drain electrode D may be physically and/or electrically connected to the pixel electrode PE via the third contact hole CNT3 defined in the passivation layer 180. In exemplary embodiments, the source electrode S and the drain electrode D may include metal, alloy, metal nitride, etc. In one exemplary embodiment, for example, the source electrode S and the drain electrode D may include aluminum, alloy containing aluminum, aluminum nitride, copper, alloy containing copper, copper nitride, molybdenum, alloy containing molybdenum, molybdenum nitride, titanium, alloy containing titanium, titanium nitride, chrome, alloy containing chrome, chrome nitride, tantalum, alloy containing tantalum, tantalum nitride, tungsten, alloy containing tungsten, tungsten nitride, neodymium, alloy containing neodymium, neodymium nitride, scandium, alloy containing scandium, scandium nitride, etc. These may be used alone or in a combination thereof. Alternatively, the source electrode S and the drain electrode D may include a transparent conductive material. In one exemplary embodiment, for example, the source electrode S and the drain electrode D may include ITO, IZO, zinc oxide, tin oxide, etc.

The passivation layer 180 may on the base substrate 110 including the gate-line GL, the switching element part TFTP and the data-line DL thereon, so that damage to the gate-line GL, the switching element part TFTP and the data-line DL may be reduced or effectively prevented by processes during manufacturing of the display substrate 100. In exemplary embodiments, the passivation layer 180 may preferably include a silicon nitride, but is not limited thereto.

The second contact hole CNT2 is defined in the passivation layer 180 and exposes the second data-pad 170. Accordingly, the second data-pad 170 may be physically and/or electrically connected to the data-pad electrode TE2 via the second contact hole CNT2.

Figure 3:
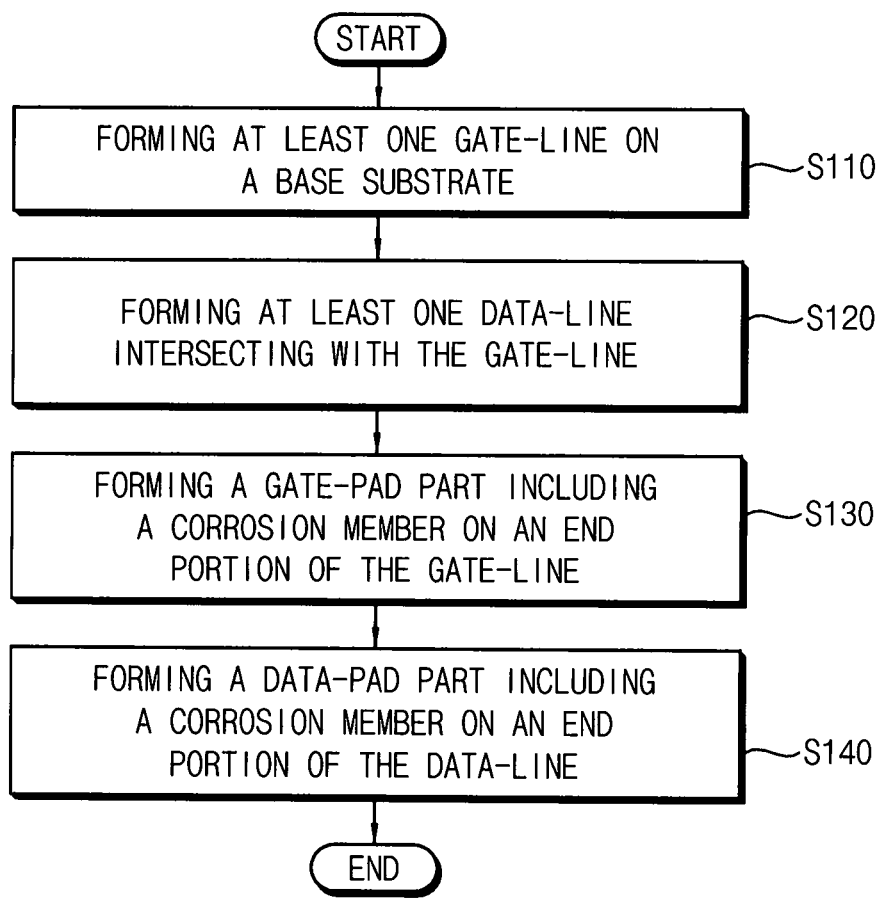
FIG. 3 is a flow chart illustrating an exemplary embodiment of a method of manufacturing a display substrate in accordance with the invention.

FIG. 3 is a flow chart illustrating an exemplary embodiment of a method of manufacturing a display substrate in accordance with the invention. FIGS. 4 through 8 are cross-sectional views illustrating the method of FIG. 3.

Referring FIGS. 3 through 8, the method of FIG. 3 may manufacture the display substrate by forming at least one gate-line GL on a base substrate 110 (S110), by forming at least one data-line DL intersecting with the gate-line GL (S120), by forming a gate-pad part GPP including a corrosion member at a terminal end portion of the gate-line GL (S130), and by forming a data-pad part DPP including a corrosion member at a terminal end portion of the data-line DL (S140).

Figure 4:
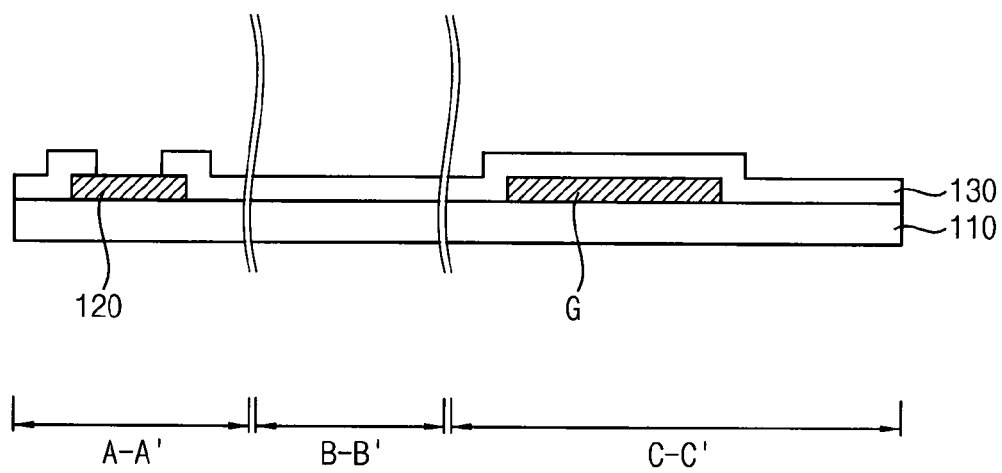
FIGS. 4 through 8 are cross-sectional views illustrating the method of FIG. 3.

As illustrated in FIG. 4, a gate metal layer may be formed on the base substrate 110, and then the gate metal layer may be partially patterned such as by a photolithography process or an etching process using an additional etching mask. In this way, a gate pattern may be formed. Here, the gate pattern may include a gate electrode G, a gate-line GL and a first gate-pad 120. The gate pattern may include metal, alloy, conductive metal oxide, a transparent conductive material, etc. In one exemplary embodiment, for example, the gate pattern may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, zinc oxide, ITO, tin oxide, indium oxide, gallium oxide, IZO, etc. These may be used alone or in a combination thereof. In exemplary embodiments, a buffer layer (not shown) may be formed on the base substrate 110. The buffer layer may reduce or effectively prevent diffusion of metal atoms and/or impurities from the base substrate 110. The base substrate 110 may have a relatively irregular surface. Where the base substrate 110 has the relatively irregular surface, the buffer layer may improve flatness of the surface of the base substrate 110.

A gate insulating layer 130 may be formed on the base substrate 110 including the gate pattern thereon. In one exemplary embodiment, for example, the gate insulating layer 130 may include silicon oxide, silicon nitride, silicon oxynitride, aluminum oxide, tantalum oxide, hafnium oxide, zirconium oxide, titanium oxide, etc. These may be used alone or in a combination thereof.

Figure 5:
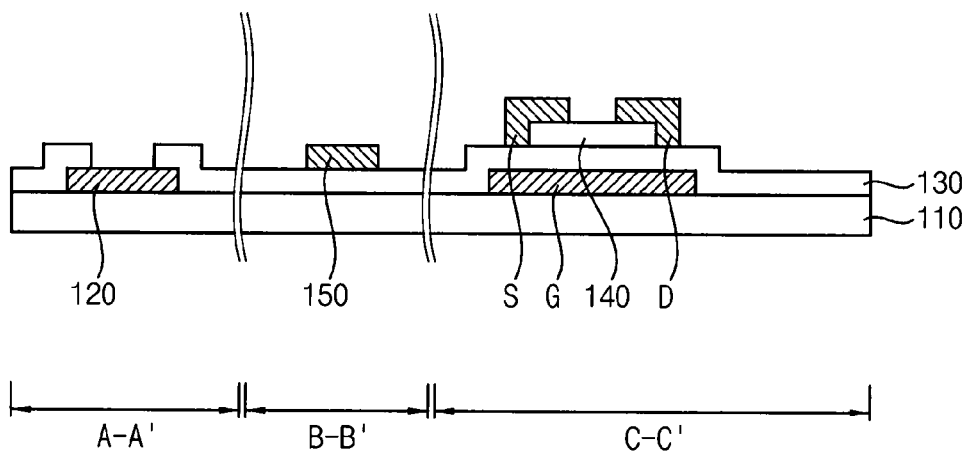

As illustrated in FIG. 5, a semiconductor layer 140 is formed on the gate insulating layer 140 and overlapping the gate electrode G A data metal layer may be formed on the gate insulating layer 130, and then the data metal layer may be partially patterned such as by a photolithography process or an etching process using an additional etching mask. In this way, a data pattern may be formed. Here, the data pattern may include a source electrode S, a drain electrode D, a data-line DL and a first data-pad 150. A portion of the semiconductor layer 140 may be exposed between the source and drain electrodes S and D spaced apart from each other. The data pattern may include metal, alloy, conductive metal oxide, a transparent conductive material, etc. In one exemplary embodiment, for example, the data pattern may be formed using aluminum, alloy containing aluminum, aluminum nitride, copper, alloy containing copper, copper nitride, molybdenum, alloy containing molybdenum, molybdenum nitride, titanium, alloy containing titanium, titanium nitride, chrome, alloy containing chrome, chrome nitride, tantalum, alloy containing tantalum, tantalum nitride, tungsten, alloy containing tungsten, tungsten nitride, neodymium, alloy containing neodymium, neodymium nitride, scandium, alloy containing scandium, scandium nitride, etc. These may be used alone or in a combination thereof. Alternatively, the data pattern may include a transparent conductive material. In one exemplary embodiment, for example, the data pattern may include ITO, IZO, zinc oxide, tin oxide, etc.

Figure 6:
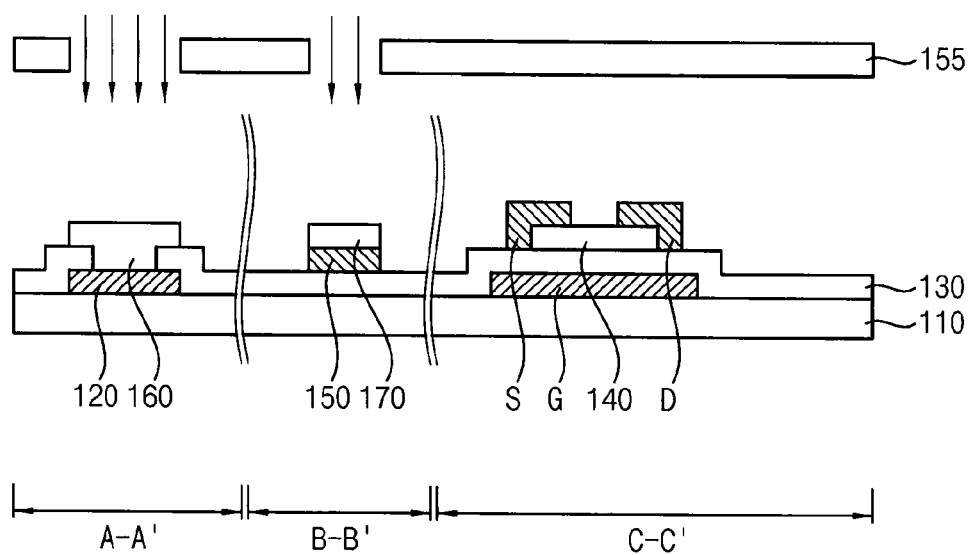

As illustrated in FIG. 6, a second gate-pad 160 may be formed on the first gate-pad 120, and a second data-pad 170 may be formed on the first data pad 150. The second gate-pad 160 and the second data-pad 170 may be formed by a fine metal mask process using a fine metal mask 155. In one exemplary embodiment, for example, the second gate-pad 160 and the second data-pad 170 may include a corrosion member. The second gate-pad 160 and the second data-pad 170 may include a same material and be in and/or on a same layer of the display substrate 100. In exemplary embodiments, the corrosion member may include at least one of a noble metal, and a conductive material having corrosion resistance. In one exemplary embodiment, for example, the noble metal may include at least one of gold, nickel, platinum, palladium, rubidium, iridium, and alloys thereof. The conductive material having the corrosion resistance may include at least one of ITO and IZO. Alternatively, a corrosion member may be further deposited on the second gate-pad 160 and/or the second data-pad 170 as an additional layer to the respective pad 160 and/or 170. The separate corrosion members on the second gate-pad 160 and/or the second data-pad 170, may include a same material and be in and/or on a same layer of the display substrate 100.

Therefore, one or more exemplary embodiment of the display substrate 100 according to the invention may have improved reliability by reducing or effectively preventing a corrosion of at least one pad part (e.g., at least one gate-pad part and at least one data-pad part) because the respective pad part includes a corrosion member to reduce or effectively prevent damage to the pad part by water or gas which permeates into the pad part, and processes during manufacturing of the display substrate 100. In addition, one or more exemplary embodiment of a method of manufacturing a display substrate according to the invention may reduce manufacturing-costs of the display substrate by forming a corrosion member only on a pad part of the display substrate (e.g., at least one gate-pad part and/or at least one data-pad part) using a thin film deposition process such as a sputtering process, an evaporation process, a chemical vapor deposition ("CVD") process, an atomic layer deposition ("ALD") process, or a vacuum deposition process, but the invention is not limited thereto. That is, the corrosion member may not be formed on other features of the display substrate, but the invention is not limited thereto.

Figure 7:
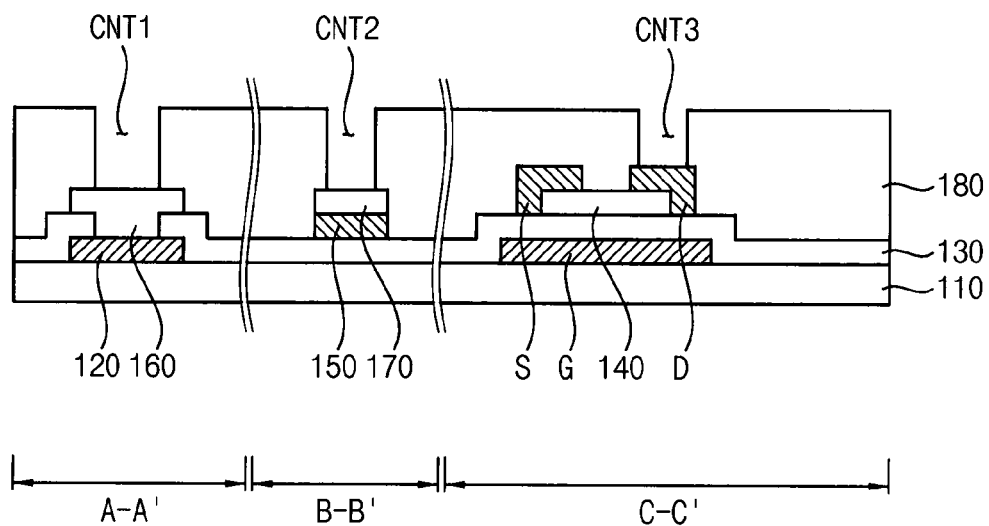

As illustrated in FIG. 7, a passivation layer 180 may be formed on the entire base substrate 110. In exemplary embodiments, the passivation layer 180 may include a silicon nitride. Subsequently, a photoresist layer (not shown) may be formed on the passivation layer 180, and then a mask may be disposed over the photoresist layer. Finally, the photoresist layer may be patterned using a mask, so that the photoresist layer may include a first pattern that exposes a portion where a first contact hole CNT1 of the gate-pad part GPP is to be formed, a second pattern that exposes a portion where a second contact hole CNT2 of the data-pad part DPP is to be formed, and a third pattern that exposes a portion where a third contact hole CNT3 of the switching element part TFTP is to be formed. In exemplary embodiments, a portion of the passivation layer 180 may be removed by an etching process using the photoresist layer as a mask. Accordingly, the first contact hole CNT1 may be defined in the passivation layer 180 to expose a portion of the second gate-pad 160 of gate-pad part GPP. Similarly, the second and third contact holes CNT2 and CNT3 may be defined in the passivation layer 180 to expose a portion of the second data-pad 170 of data-pad part DPP, and a portion of the drain electrode D, respectively.

Figure 8:
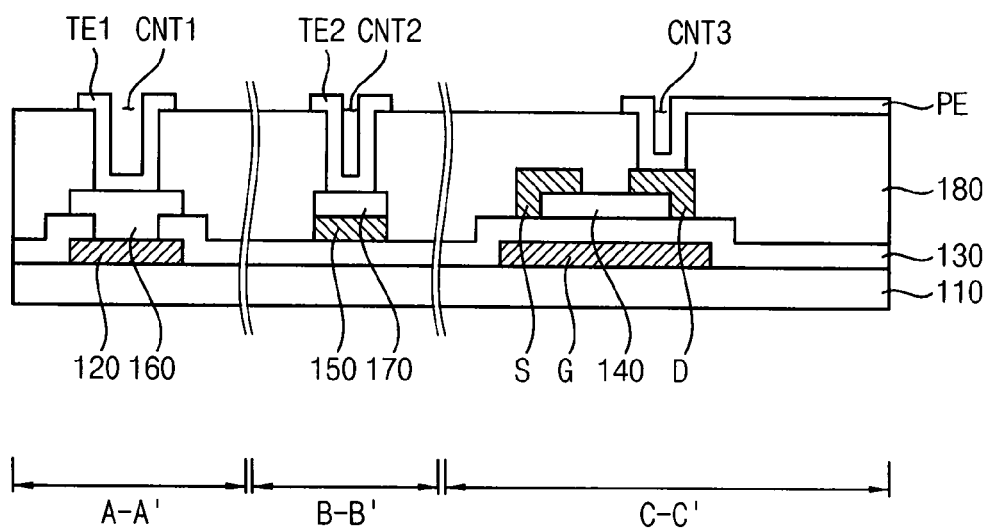

As illustrated in FIG. 8, a transparent electrode layer may be formed on the entire base substrate 110 including the first through third contact holes CNT1, CNT2 and CNT3 defined in the passivation layer 180. The transparent electrode layer may include a transparent conductive material. In one exemplary embodiment, for example, the transparent electrode layer may include ITO, IZO, etc. In exemplary embodiments, the transparent electrode layer may be etched to form a gate-pad electrode TE1, a data-pad electrode TE2 and a pixel electrode PE. The pad electrode TE1, the data-pad electrode TE2 and the pixel electrode PE include a same material and are in and/or on a same layer of the display substrate 100. The gate-pad electrode TE1 may be connected to the second gate-pad 160 via the first contact hole CNT1, and the data-pad electrode TE2 may be connected to the second data-pad 170 via the second contact hole CNT2. Furthermore, the pixel electrode PE may be connected to the drain electrode D via the third contact hole CNT3.

Therefore, one or more exemplary embodiment of a display substrate 100 according to the invention may have improved reliability by reducing or effectively preventing corrosion of at least one pad part (e.g., at least one gate-pad part and at least one data-pad part) because the respective pad part includes a corrosion member to reduce or effectively prevent damage to the pad part by water or gas which permeates into the pad part, and processes during manufacturing of the display substrate. In addition, one or more exemplary of a method of manufacturing a display substrate according to the invention may reduce manufacturing-costs of the display substrate by forming a corrosion member only on a pad part of the display substrate (e.g., at least one gate-pad part and/or at least one data-pad part) such as by using a thin film deposition process. That is, the corrosion member may not be formed on other features of the display substrate, but the invention is not limited thereto.

One or more exemplary embodiment of the invention may be applied to any of a number of electronic devices including a display substrate. In exemplary embodiments, for example, the invention may be applied to a television, a computer monitor, a laptop, a digital camera, a cellular phone, a smart phone, a smart pad, a personal digital assistant ("PDA"), a portable multimedia player ("PMP"), a MP3 player, a navigation system, a game console, a video phone, etc.

The foregoing is illustrative of the invention and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A display substrate comprising:
   a base substrate;
   a gate-line on the base substrate;
   a data-line intersecting the gate-line;
   a pixel area defined on the base substrate;
   a gate-pad part connected to an end portion of the gate-line and comprising:
      a first gate-pad connected to the end portion of the gate-line;
      a gate-pad electrode connected to the first gate-pad and exposed outside the display substrate; and
      a second gate-pad between the first gate-pad and the gate-pad electrode, the second gate-pad comprising a gate corrosion member; and
   a data-pad part connected to an end portion of the data-line and comprising a data corrosion member,
   wherein among layers disposed on the base substrate, the gate corrosion member between the first gate-pad and the gate-pad electrode is in a same layer as the data corrosion member.

2. The display substrate of claim 1, wherein the gate-pad part further comprises:
   a passivation layer on the gate-line, and
   a contact hole defined in the passivation layer and exposing the second gate-pad.

3. The display substrate of claim 1, wherein the data-pad part further comprises:
   a first data-pad connected to the end portion of the data-line;
   a second data-pad on the first data-pad and comprising the data corrosion member; and
   a data-pad electrode connected to the second data-pad.

4. The display substrate of claim 3, wherein the data-pad part further comprises:
   a passivation layer on the data-line, and
   a contact hole defined in the passivation layer and exposing the second data-pad.

5. The display substrate of claim 1, wherein the gate and data corrosion members comprise at least one of a noble metal, and a conductive material having corrosion resistance.

6. The display substrate of claim 5, wherein the noble metal comprises at least one of gold (Au), nickel (Ni), platinum (Pt), palladium (Pd), rubidium (Ru), iridium (Ir), and alloys thereof.

7. The display substrate of claim 5, wherein the conductive material having the corrosion resistance comprises at least one of indium tin oxide and indium zinc oxide.

8. The display substrate of claim 1, further comprising:
   a switching element comprising a gate electrode extended from the gate-line, a source electrode extended from the data-line and a drain electrode spaced apart from the source electrode; and
   a pixel electrode connected to the switching element.

9. A method of manufacturing a display substrate, the method comprising:
   forming a gate-line on a base substrate;
   forming a data-line intersecting the gate-line;
   defining a pixel area on the base substrate;
   forming a gate-pad part connected to an end portion of the gate-line, comprising:
      forming mate metal layer on the base substrate;
      forming a first gate-pad by patterning the gate metal layer;
      forming mate-pad electrode connected to the first gate-pad and exposed outside the display substrate; and
      forming a second gate-pad between the first gate-pad and the gate-pad electrode, the second gate-pad comprising a gate corrosion member; and
   forming a data-pad part comprising a data corrosion member, connected to an end portion of the data-line,
   wherein among material layers formed on the base substrate, the gate corrosion member between the first gate-pad and the gate-pad electrode is formed from a same material layer from which the data corrosion member is formed.

10. The method of claim 9, wherein the forming the gate-pad part further comprises:
    forming a gate insulating layer on the second gate-pad;
    forming a passivation layer on the gate insulating layer, and
    forming a first contact hole in the passivation layer and exposing the second gate-pad.

11. The method of claim 10, wherein the forming the second gate-pad comprises a sputtering process, an evaporation process, a chemical vapor deposition process, an atomic layer deposition process or a vacuum deposition process.

12. The method of claim 10, wherein the forming the data-pad part comprises:
    forming a data metal layer on the gate insulating layer;
    forming a first data-pad by patterning the data metal layer;
    forming a second data-pad comprising the data corrosion member, on the first data-pad; and
    forming a data-pad electrode connected to the second data-pad.

13. The method of claim 12, wherein forming the data-pad part further comprises:
    forming the passivation layer on the second data-pad, and
    forming a second contact hole in the passivation layer and exposing the second data-pad.

14. The method of claim 13, wherein forming the second data-pad comprises a sputtering process, an evaporation process, a chemical vapor deposition process, an atomic layer deposition process or a vacuum deposition process.

15. The method of claim 9, wherein the gate and data corrosion member comprises at least one of a noble metal, and a conductive material having corrosion resistance.

16. The method of claim 15, wherein the noble metal comprises at least one of gold, nickel, platinum, palladium, rubidium, iridium, and alloys thereof.

17. The method of claim 16, wherein the conductive material having the corrosion resistance comprises at least one of indium tin oxide and indium zinc oxide.

18. The method of claim 9, further comprising:
    forming a switching element comprising a gate electrode extended from the gate-line, a source electrode extended from the data-line and a drain electrode spaced apart from the source electrode; and
    forming a pixel electrode connected to the switching element.

* * * * *